United States Patent [19]

Gilliam

[11] Patent Number: 5,566,107
[45] Date of Patent: Oct. 15, 1996

[54] PROGRAMMABLE CIRCUIT FOR ENABLING AN ASSOCIATED CIRCUIT

[75] Inventor: Gary R. Gilliam, Boise, Id.

[73] Assignee: Micron Technology, Inc., Boise, Id.

[21] Appl. No.: 437,438

[22] Filed: May 5, 1995

[51] Int. Cl.$^6$ .............................. G11C 7/00; H01H 37/76
[52] U.S. Cl. ................. 365/200; 365/225.7; 365/189.05; 327/525
[58] Field of Search .............................. 365/200, 225.7, 365/96, 189.05, 230.08; 327/525

[56] References Cited

U.S. PATENT DOCUMENTS

| | | | |
|---|---|---|---|
| 5,233,566 | 8/1993 | Imamiya et al. | 365/200 |
| 5,345,110 | 9/1994 | Renfro et al. | 307/272.3 |
| 5,442,587 | 8/1995 | Kuwagata et al. | 365/200 |

Primary Examiner—David C. Nelms
Assistant Examiner—Trong Phan
Attorney, Agent, or Firm—Seed and Berry LLP

[57] ABSTRACT

A circuit enables an associated function circuit in response to an activate signal. The enable circuit includes a zero-standby-current select circuit that may be programmed in either a select or unselect state. When programmed in a select state, the select circuit generates a select signal in response to the activate signal. When programmed in an unselect state, the select circuit prohibits the generation of the select signal in response to the activate signal. When it is programmed in either the select or unselect state, the select circuit dissipates substantially zero quiescent power. A latch generates and maintains, in response to the select signal, an enable signal that enables the function circuit.

25 Claims, 3 Drawing Sheets

PROGRAMMABLE CIRCUIT FOR ENABLING AN ASSOCIATED CIRCUIT

TECHNICAL FIELD

The invention relates generally to electronic devices and more specifically to a programmable enable circuit for use in an integrated device such as a memory device.

BACKGROUND OF THE INVENTION

Many integrated-circuit devices, such as memory devices, include function circuits that can be selected to perform predetermined functions or provide predetermined design options. For example, a memory device may include substitution circuits that, when enabled, replace defective matrix memory columns with redundant memory columns. If, during initial testing of the memory device, a matrix column is found to be defective, a substitution circuit corresponding to or including a redundant memory column is selected to perform the replacement. Typically, such a replacement is transparent to the circuitry external to the memory device, and entails disabling the defective matrix memory column and routing data to the redundant memory column whenever the external address signal selects the defective column.

Because such integrated circuit devices often include a predetermined number of function circuits, each function circuit is associated with or includes an enable circuit that is programmed to enable the function circuit if it is selected, or is left unprogrammed if the function circuit is not selected. One reason such integrated circuit devices include a predetermined number of function circuits is that the need for repair-type circuits (such as the above-discussed substitution circuits) often cannot be determined until after the integrated circuit device has been manufactured. Another reason is that the mask rework and other changes required to alter the number of function circuits from batch to batch may significantly increase the cost and complexity of the manufacturing process. Thus, the programmable enable circuits allow the memory device to select and activate only the needed function circuits.

A problem with existing programmable enable circuits, such as disclosed in U.S. Pat. No. 5,345,110 to Renfro et at., is that in the programmed or unprogrammed state, they often conduct a standby or quiescent current, i.e., dissipate power at times other than while their components are switching. The sum of the standby currents of all of the enable circuits in the integrated circuit device often generates additional heat in the integrated circuit device and increases the power that the integrated circuit device requires.

An existing enable circuit that is responsive to an activation signal, which is typically generated elsewhere on the integrated circuit device, only conducts a standby current when it is in a programmed state and the activation signal is present at its input. Standby current in such a circuit has been reduced by pulsing the activation signal. However, such pulsing often requires additional circuitry on the integrated circuit device and does not eliminate the enable circuit's quiescent power dissipation.

SUMMARY OF THE INVENTION

In accordance with one aspect of the present invention, a circuit for enabling an associated function circuit in response to an activate signal includes a select circuit that may be programmed in either a select or unselect state. When programmed in a select state, the select circuit generates a select signal in response to the activate signal. When programmed in an unselect state, the select circuit prohibits the generation of the select signal in response to the activate signal. Whether it is programmed in the select state or the unselect state, the select circuit conducts substantially zero standby current in response to the activate signal. A latch in communication with the select circuit and the associated function circuit generates and maintains, in response to the select signal, an enable signal that enables the function circuit

DETAILED DESCRIPTION OF THE INVENTION

Figure 1:
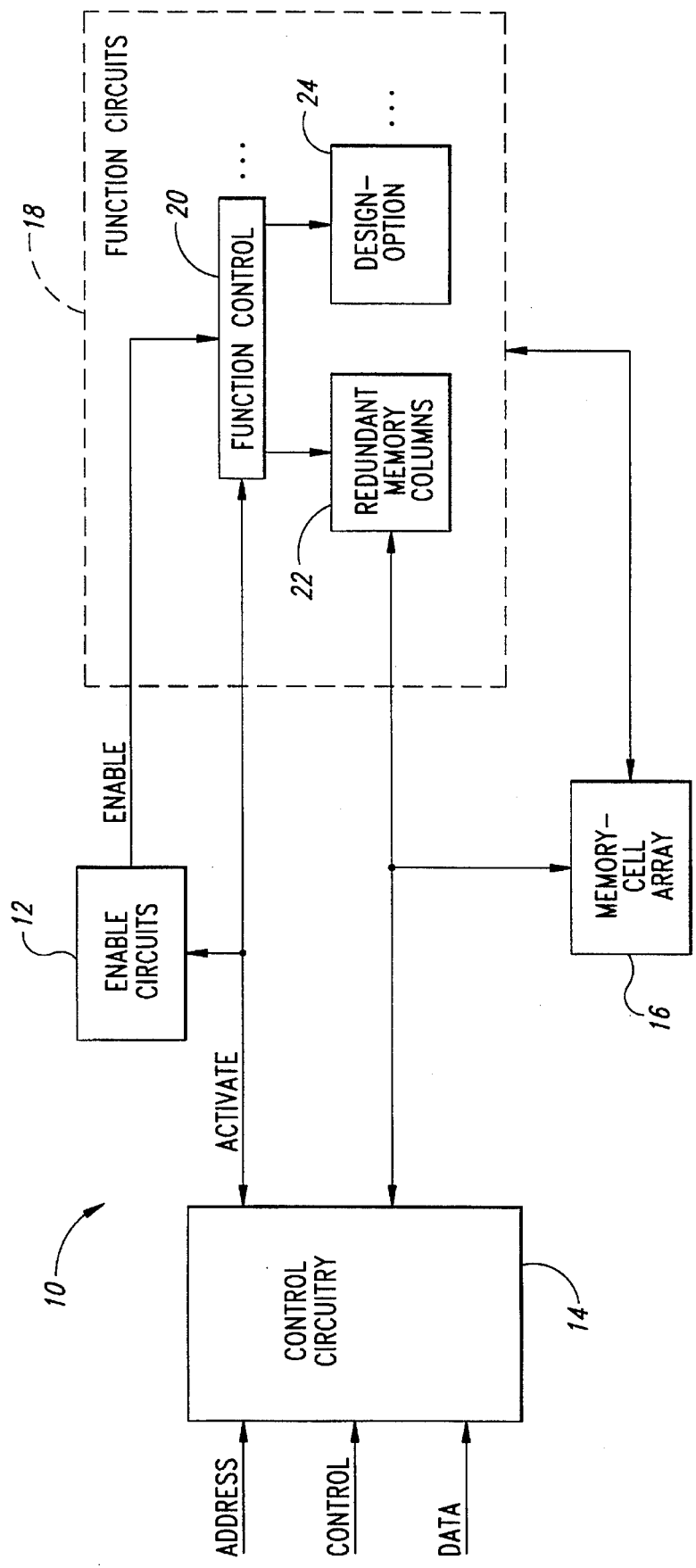
FIG. 1 is a block diagram of a memory circuit incorporating a preferred embodiment of the present invention.

FIG. 1 is a block diagram of a memory device 10 that incorporates one or more enable circuits 12 that are constructed and operate according to the present invention. In one aspect of the invention, memory device 10 is a Dynamic Random Access Memory (DRAM). Memory device 10 also includes memory control circuit 14, an array or matrix of memory cells 16, and function circuits 18, which include function control circuit 20, redundant memory columns 22, and design-option circuits 24. Function circuits 18 may include other functional blocks as indicated by the dotted lines. Although function control circuit 20 is shown separate from redundant columns 22 and design-option circuits 24, it may have portions incorporated into each of these circuits in other aspects of the invention.

Based upon the results of the initial testing of memory device 10, associated ones of enable circuits 12 are programmed to enable selected function circuits 18. For example, if a column of memory cells in memory cell array 16 is found to be defective, the testing circuitry (not shown) will program an enable circuit 12 to enable the function control circuit 20 to effectively replace the defective memory column with a redundant memory column 22. Or, an associated enable circuit 12 may be programmed to enable the function control circuit 20 to activate a selected design-option 24.

During the operation of memory device 10, control circuit 14 receives address, control, and data signals from circuitry (not shown) external to device 10. In response to these signals, control circuit 14, which may include an address decoder and address and data latches (not shown), controls device 10 to perform, among other tasks, the reading and writing of data from and to memory cell array 16. Control circuit 14 also supplies an "activate" signal to the enable circuits 12. If an enable circuit 12 has been programmed to enable an associated function circuit 18, then that enable circuit 12 generates an "enable" signal that is coupled to the associated function circuit 18. If an enable circuit 12 has been left in its initial unprogrammed state, it does not generate an "enable" signal and, therefore, does not enable its associated function circuit 18.

As discussed in more detail below, enable circuits 12 are constructed such that whether the "activate" signal is present or absent, they do not conduct or dissipate any standby current in either a programmed or unprogrammed state. Thus, enable circuits 12 reduce the overall power required and the heat generated by memory device 10. Furthermore, enable circuits 12 allow control circuit 14 to supply a constant, i.e., DC, activate signal without increasing the power dissipated by device 10.

Figure 2:
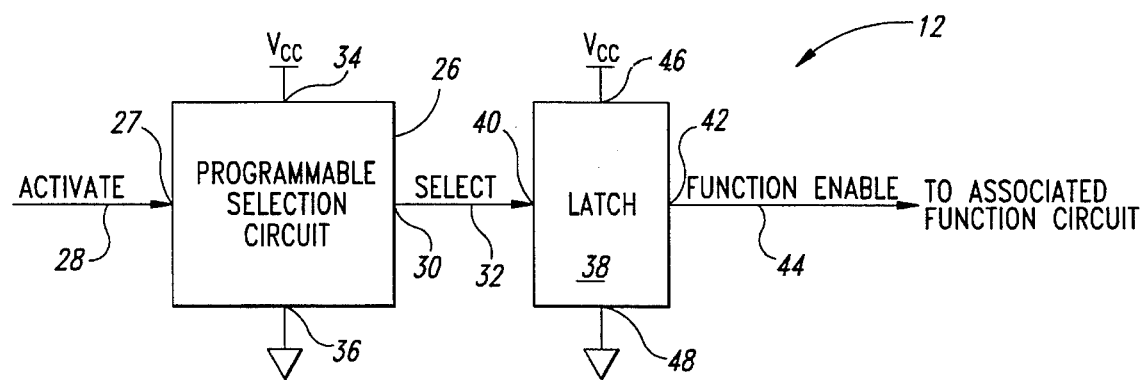
FIG. 2 is a block diagram of a preferred embodiment of an enable circuit of FIG. 1 according to the present invention.

FIG. 2 is a block diagram of a preferred embodiment of an enable circuit 12 used in the memory device 10 of FIG. 1. Enable circuit 12 includes a programmable selection circuit 26 having an input terminal 27 coupled to an activate line 28, which is coupled to control circuitry 14 of FIG. 1, and an output terminal 30 coupled to a select line 32. Selection circuit 26 also has a first power supply terminal 34 coupled to a voltage Vcc and a second supply terminal 36 coupled to ground. Enable circuit 12 also includes a latch 38 having an input terminal 40 coupled to select line 32, and an output terminal 42 coupled to a function enable line 44, which is coupled to and provides a "function enable" signal to an associated function circuit 18 of FIG. 1. Latch 38 also includes a first power supply terminal 46 coupled to voltage Vcc and a second power supply terminal 48 coupled to ground.

In operation when in a programmed or a select state, selection circuit 26 receives the "activate" signal on line 28, and in response thereto may generate a "select" signal on select line 32 depending upon how the selection circuit 26 has been programmed. Circuit 26 generates the "select" signal while drawing zero standby current from the power supply (not shown) that provides voltage Vcc. Latch 38, which in this aspect of the invention is asynchronous, receives and latches the "select" signal, and in response to the "select" signal generates an "enable" signal on the function enable line 44.

In operation when in an unprogrammed or unselect state, selection circuit 26 does not generate the "select" signal on line 32. That is, circuit 26 generates the complement of the "select" signal on line 32. In response to the absence of the "select" signal, latch 38 does not generate the "enable" signal. That is, latch 38 generates the complement of the "enable" signal on line 44, and thus disables the associated function circuit 18. Even in the unprogrammed state, however, selection circuit 26 draws zero standby current from the power supply. Thus, selection circuit 26 can be used with both a pulsed and a DC activate signal. By allowing the use of a DC "activate" signal, selection circuit 26 allows the elimination from device 10 of the circuitry (not shown) required to pulse the activate signal.

Figure 3:
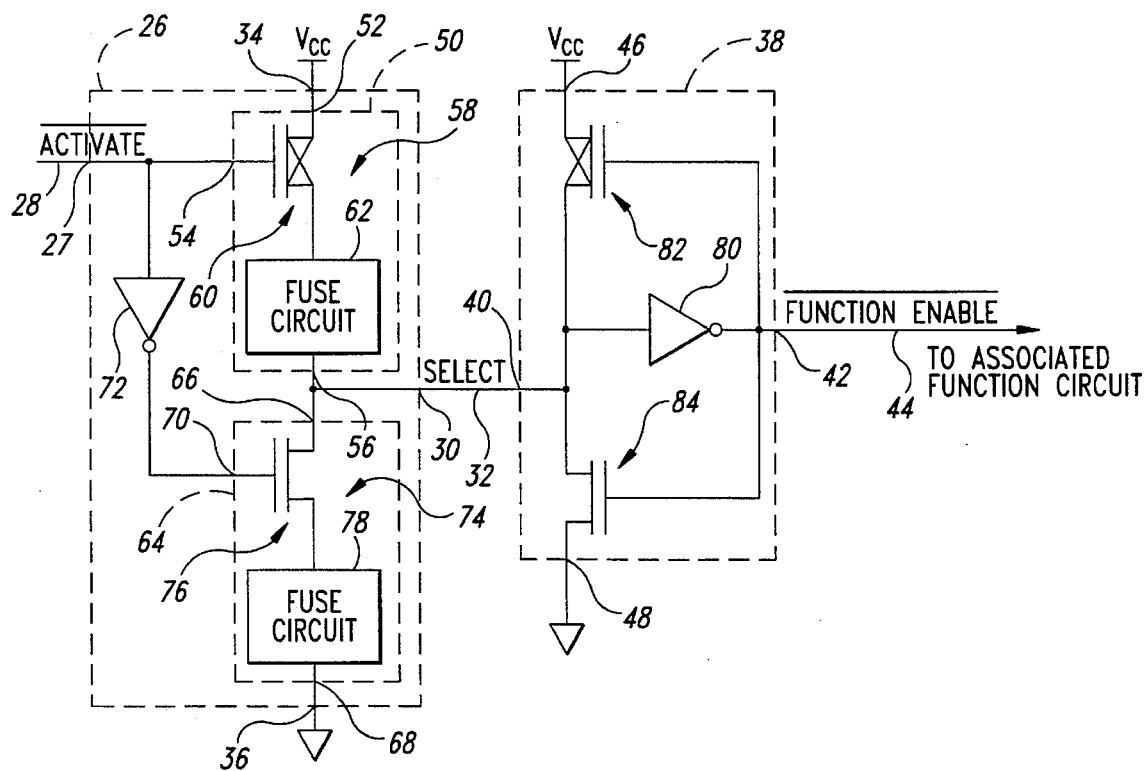
FIG. 3 is a schematic diagram of a preferred embodiment of an embodiment of the enable circuit of FIG. 2.

FIG. 3 is a schematic diagram of a preferred embodiment of the enable circuit 12 of FIG. 2. As shown, programmable selection circuit 26 includes a first switch circuit 50 having a power supply terminal 52 coupled to terminal 34, a control terminal 54 coupled to terminal 27, and an output terminal 56 coupled to output terminal line 30. First switch circuit 50 also includes a circuit branch 58 that is serially coupled between power supply terminal 52 and output terminal 56. Circuit branch 58 includes a switch 60, which in one aspect of the invention is a P-channel transistor having its source coupled to power supply terminal 52, its gate coupled to control terminal 54, and its drain coupled to a first input of a fuse circuit 62, which has an output coupled to output terminal 56. As discussed below, fuse circuit 62 is programmable to be either in an open or closed state. Furthermore, the positions of switch 60 and fuse 62 may be interchanged without affecting the operation of select circuit 26.

Selection circuit 26 also includes a second switch circuit 64 that is similar in construction and operation to first switch circuit 50. Switch circuit 64 includes an output terminal 66 coupled to output terminal 30, a power supply terminal 68 coupled to power supply terminal 36, and a control terminal 70 that is coupled to the output of an inverter 72, which has an input terminal coupled to input terminal 27. Second switch 64 includes a second circuit branch that is serially coupled between output terminal 66 and power supply terminal 68. Circuit branch 74 includes a second switch 76, which in one aspect of the invention is an N-channel transistor having its drain coupled to output terminal 66, its gate coupled to control terminal 70, and its source coupled to an input of a second fuse circuit 78, which has an output coupled to power supply terminal 68. As discussed above for fuse circuit 62, fuse circuit 78 can be programmed to be either in an open or closed circuited state. Furthermore, the positions of switch 76 and fuse circuit 78 may be interchanged without affecting the operation of select circuit 26.

Latch 38 includes an inverter 80 having an input terminal coupled to input terminal 40 and an output terminal coupled to output terminal 42. A first feedback switch 82 is coupled between output terminal 42 and input terminal 40. In one aspect of the invention, feedback switch 82 is a P-channel transistor having its gate coupled to output terminal 42, its source coupled to power supply terminal 46, and its drain coupled to input terminal 40. Latch 38 may also include an optional second feedback switch 84, which is coupled between output terminal 42 and input terminal 40. In one aspect of the invention, the second feedback switch 84 is an N-channel transistor having its gate coupled to output terminal 42, its source coupled to power supply terminal 48, and its drain coupled to input terminal 40.

In operation, and as stated above, programmable selection circuit 26 can be programmed in either a select state or an unselect state. When programmed in a select state, fuse circuit 62 is programmed in a closed state so as to couple the drain of P-channel transistor 60 to output terminal 56. In contrast, fuse circuit 78 is programmed in an open state so as to disconnect the source of N-channel transistor 76 from power supply terminal 68. Thus, when the "activate" signal on line 28 becomes active low, transistor 60 conducts and drives line 32 with an active high "select" signal. The "activate" signal, via inverter 72, drives the gate of transistor 76 high. However, because the source of transistor 76 is disconnected from any circuit node, i.e., left floating, transistor 76 does not conduct. Therefore, because there is no current path between Vcc and ground, the selection circuit 26 conducts no standby current even when the "activate" signal is active low.

The active high "select" signal on line 32 is converted by inverter 80 to the active low "function enable" signal on enable line 44. Thus, the active low "enable" signal enables the associated function circuit 18. Additionally, the active low "enable" signal is applied to the gate of P-channel transistor 82, which thus conducts and drives the input of inverter 80 to a high level. Thus, the feedback loop of inverter 80 and transistor 82 maintains the "function enable" signal at an active low level even after the "activate" signal returns to an inactive high state. Therefore, although the "activate" signal may remain active low indefinitely without causing selection circuit 26 to conduct standby current, it also may return to an inactive high level without affecting the active low level of the "function enable" signal.

When selection circuit 26 is programmed in an unselect state, fuse circuit 62 is programmed in an open state, and fuse circuit 78 is programmed in a closed state. In response to an active low level "activate" signal, transistor 76 turns on and, through closed fuse circuit 78, drives the "select" signal inactive low. Inverter 80 converts this inactive low "select" signal to an inactive high "function enable" signal, which thus disables the associated function circuit 18. Because the "enable" signal is inactive high, transistor 82 does not conduct, and the feedback loop is open. Again, because there is no direct current path between Vcc and ground, selection circuit 26 does not conduct a standby current at any time.

When optional transistor 84 is omitted from latch 38, the "activate" signal must periodically be driven active low in order to ensure that any leakage charge that accumulates on select line 32 is removed so that it does not generate a voltage level that will appear to inverter 80 as a logic high, and thus erroneously drive the "enable" signal to an active low level. Although the "activate" signal should be periodically driven active low, an advantage to such a circuit is a reduction in the overall area of memory device 10 due to the omission of transistors 84 from all of the latches 38.

Conversely, when transistor 84 is present, the inactive high "enable" signal turns transistor 84 on and thus drives the input of inverter 80 to a low level. Thus, the feedback loop of inverter 80 and transistor 84 maintains the "enable" signal at an inactive high level even after the "activate" signal goes inactive high. Thus, an advantage to the presence of transistor 84 is that once the "activate" signal goes active low for a time sufficient to drive the "function enable" signal inactive high, it neither need be kept active low nor periodically repeated since the feedback action of transistor 84 will maintain the "enable" signal active high.

Figure 4A:
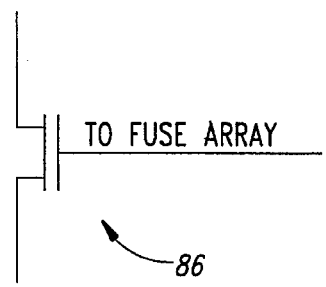
FIGS. 4a–4c are schematic diagrams of several alternative embodiments of the fuse circuits used in the enable circuit of FIG. 3.
Figure 4B:
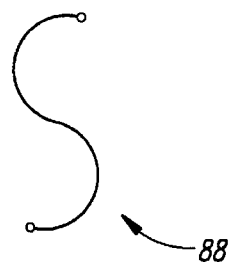
Figure 4C:
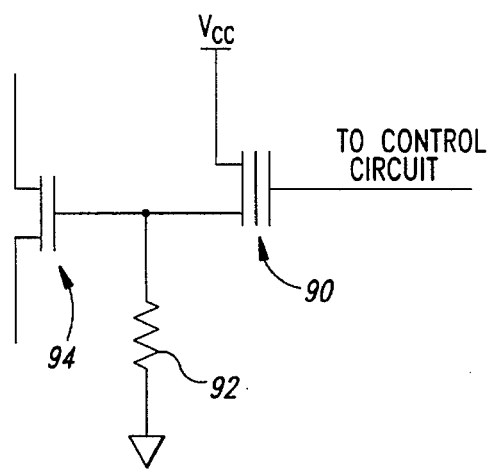

FIGS. 4a–4c are examples of various fuse circuits 62 and 78 that may be used in the selection circuit 26 of FIG. 3. FIG. 4a shows a transistor 86 whose control terminal or gate is coupled to a fuse in a fuse array (not shown). When the voltage level at the gate is high with respect to the source (or in the case of a P-channel transistor, low) the transistor becomes a short or closed circuit. Contrarily, when the voltage level at the gate is low (or high in the case of a P-channel transistor) the transistor acts as an open circuit. The fuses in the fuse array are selectively programmed to drive the transistor at an appropriate level. One advantage of using a fuse array is that the fuses can be formed in one area of the memory device 10. Such formation may reduce the overall area of memory device 10.

FIG. 4b shows a fuse 88. Fuse 88 may be of the laser type, which can be cut with a laser after memory device 10 has been formed but before it has been packaged. Thus, when a laser fuse 88 is cut, it acts as an open circuit, and when it is not cut, it acts as a closed circuit. Alternatively, fuse 88 may be of the electrical type. Such a fuse can be opened by driving a current through it sufficient to melt it and cause it to open.

FIG. 4c is a schematic diagram of a fuse circuit that includes a nonvolatile memory cell 90, a resistive element 92, and a transistor 94. In operation, nonvolatile memory cell 90 is programmed in the appropriate state so as to either drive transistor 94 to become an open or closed circuit. For example, when cell 90 is programmed in a nonconducting state, the gate of transistor 94 is driven via the resistor 92 to ground. Thus, N-channel transistor 94 acts as an open circuit (or in the case of a P-channel transistor a closed circuit). Alternatively, if nonvolatile memory cell 90 is programmed in a conducting state, it drives the gate of transistor 94 high.

Thus, transistor 94 acts as a closed circuit (or in the case of a P-channel transistor an open circuit). Typically, cell 90 is programmed during the initial testing of memory device 10 via a line from control circuitry 14 of FIG. 1. For example, cell 90 may be an electrically erasable and programmable memory cell, examples of which are well known in the art.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An enable circuit for selectively enabling an associated function circuit in response to a first level of an activate signal, the enable circuit comprising:

a select circuit that when programmed in a select state and in response to said first level generates on an output line a select signal and conducts substantially zero standby current, and that when programmed in an unselect state and in response to said first level generates on said output line the complement to said select signal and conducts substantially zero standby current; and a latch in communication with said select circuit and said associated function circuit and operable to generate and maintain an enable signal in response to said select signal.

2. The enable circuit of claim 1 wherein said select circuit comprises:

a first switch circuit operable to close in response to said first level of said activate signal;

a first selectively conductive element connected in series with said first switch circuit, the series combination of said first switch circuit and said first selectively conductive element being connected between a voltage corresponding to said select signal and the output line of said select circuit, said first selectively conductive element being conductive when said select circuit is programmed in said select state and being non-conductive when said select circuit is programmed in said unselect state;

a second switch circuit operable to close in response to said first level of said activate signal; and a second selectively conductive element connected in series with said second switch, the series combination of said second switch circuit and said second selectively conductive element being connected between the output line of said select circuit and a voltage corresponding to the complement to said select signal, said second selectively conductive element being non-conductive when said select circuit is programmed in said select state and being conductive when said select circuit is programmed in said unselect state.

3. The enable circuit of claim 2 wherein said first selectively conductive element comprises a first fuse circuit that is closed when said select circuit is programmed in said select state and that is open when said select circuit is programmed in said unselect state, and wherein said second selectively conductive element comprises a second fuse circuit that is open when said select circuit is programmed in said select state and closed when said select circuit is programmed in said unselect state.

4. The enable circuit of claim 3 wherein said first and second fuse circuits each comprise a laser fuse.

5. The enable circuit of claim 3 wherein said first and second fuse circuits each comprise an electrical fuse.

6. A method for enabling a function circuit, comprising:

programming a selection circuit in a select or unselect state to respectively generate a select signal or the complement of said select signal in response to a first level of an activate signal such that said select circuit draws substantially zero quiescent current from an associated power supply when programmed in either of said states;

generating an enable signal in response to said select signal; and maintaining said enable signal in the absence of said first level of said activate signal.

7. The method of claim 6 wherein said programming comprises:

closing a first switch circuit in response to said first level of said activate signal and opening a second switch circuit serially coupled to said first switch circuit when said select circuit is programmed in said select state; and closing said second switch circuit in response to said first level of said activate signal and opening said first switch circuit when said select circuit is programmed in said unselect state, said select signal being generated on an output terminal between said first and second switch circuits.

8. The method of claim 7 wherein:

said programming a selection circuit in a select state comprises closing a first fuse circuit connected in series with said first switch circuit and said output terminal and opening a second fuse circuit connected in series with said second switch circuit and said output terminal; and said programming a selection circuit in an unselect state comprises opening said first fuse circuit and closing said second fuse circuit.

9. An enable circuit, coupled to an activate line, for selectively enabling an associated function circuit in response to an enable signal generated in response to an active level of an activate signal, comprising:

a zero-standby-current select circuit having a select input terminal coupled to said activate line and having a select output terminal, said select circuit generating an active level of a select signal on said select output terminal in response to said active level of said activate signal when said select circuit is programmed active, and said select circuit generating an inactive level of said select signal on said select output terminal in response to said active level of said activate signal when said select circuit is programmed inactive;

a select line coupled to said select output terminal;

a latch having a latch input coupled to said select line and a latch output terminal, said latch generating an enable signal in response to said active level of said select signal; and an enable line coupled between said latch output terminal and an enable terminal of said associated function circuit.

10. The enable circuit of claim 9 wherein said select circuit comprises:

a first switch circuit having a first-switch input terminal coupled to said select input terminal and a first-switch output terminal coupled to said select output terminal;

an inverter having an inverter input terminal coupled to said select input terminal and having an inverter output terminal; and a second switch circuit having a second-switch input terminal coupled to said inverter output terminal and a second-switch output terminal coupled to said select output terminal.

11. The enable circuit of claim 10 wherein:

said first switch circuit comprises,
a first power-supply terminal, and
a first circuit branch coupled between said first power-supply terminal and said first-switch output terminal, said first branch comprising:
a first switch having a first control terminal coupled to said first-switch input terminal, and
a first fuse circuit serially coupled to said first switch; and said second switch circuit comprises,
a second power-supply terminal, and
a second circuit branch coupled between said second power-supply terminal and said second-switch output terminal, said second branch circuit comprising:
a second switch having a second control terminal coupled to said second-switch input terminal, and
a second fuse circuit serially coupled to said second switch.

12. The enable circuit of claim 11 wherein said first and second fuse circuits each comprise a laser fuse.

13. The enable circuit of claim 11 wherein said first and second fuse circuits each comprise an electrical fuse.

14. The enable circuit of claim 11 wherein said first and second switches respectively comprise a P-channel and an N-channel transistor.

15. The enable circuit of claim 9 wherein said latch comprises:

an inverter coupled between said latch input and latch output terminals; and a switch having a control terminal coupled to said latch output terminal and a drive terminal coupled to said latch input terminal.

16. The enable circuit of claim 15 wherein said switch comprises a P-channel transistor.

17. The enable circuit of claim 15 wherein said switch comprises an N-channel transistor.

18. A memory device, comprising:

a control circuit operable to generate an activate signal having active and inactive levels;

an array of memory cells in communication with said control circuit and arranged in rows and columns;

one or more function circuits in communication with said control circuit;

one or more enable circuits each in communication with said control circuit and an associated one of said function circuits, each enable circuit comprising,
a select circuit that when programmed in a select state and in response to said active level of said activate signal generates a select signal and conducts substantially zero standby current, and that when programmed in an unselect state and in response to active level of said activate signal generates the complement to said select signal and conducts substantially zero standby current; and
a latch in communication with said select circuit and operable to generate and maintain, in response to said select signal, an enable signal for enabling said associated function circuit.

19. The memory device of claim 18 wherein said select circuit comprises:

a first switch circuit operable to close in response to said active level of said activate signal;

a first selectively conductive element connected in series with said first switch circuit, the series combination of said first switch circuit and said first selectively conductive element being connected between a voltage corresponding to said select signal and the output line of said select circuit, said first selectively conductive element being conductive when said select circuit is programmed in said select state and being non-conductive when said select circuit is programmed in said unselect state;

a second switch circuit operable to close in response to said active level of said activate signal; and a second selectively conductive element connected in series with said second switch, the series combination of said second switch circuit and said second selectively conductive element being connected between said select circuit and a voltage corresponding to the complement to said select signal, said second selectively conductive element being non-conductive when said select circuit is programmed in said select state and being conductive when said select circuit is programmed in said unselect state.

20. The memory device of claim 19 wherein said first selectively conductive element comprises a first fuse circuit that is closed when said select circuit is programmed in said select state and that is open when said select circuit is programmed in said unselect state, and wherein said second selectively conductive element comprises a second fuse circuit that is open when said select circuit is programmed in said select state and closed when said select circuit is programmed in said unselect state.

21. The memory device of claim 18, further comprising:

a redundant column of memory cells in communication with a corresponding one of said function circuits; and wherein said corresponding function circuit, in response to an enable signal from an associated select circuit, is operable to replace a defective one of said array columns of memory cells with said redundant column.

22. A programmable selection circuit, comprising:

first and second supply terminals;

an input terminal coupled to receive an activate signal;

an output terminal that provides a selection signal;

a first switch having a control terminal coupled to said input terminal, a first switch terminal coupled to said first supply terminal, and a second switch terminal;

a first fuse circuit having a first fuse terminal coupled to said second switch terminal, and having a second fuse terminal coupled to said output terminal;

a second switch having a control terminal coupled to said input terminal, a first switch terminal coupled to said output terminal, and a second switch terminal; and a second fuse circuit having a first fuse terminal coupled to said second switch terminal of said second switch, and having a second fuse terminal coupled to said second supply terminal.

23. The programmable selection circuit of claim 22, further comprising an inverting circuit that is coupled between said input terminal and said control terminal of said second switch.

24. The programmable selection circuit of claim 22, further comprising a latch having a latch input terminal coupled to said output terminal, and having a latch output terminal that provides an enable signal.

25. The programmable selection circuit of claim 22 wherein said first and second fuse circuits each comprise:

a third switch having a control terminal, a first switch terminal coupled to said first fuse terminal, and a second switch terminal coupled to said second fuse terminal;

a nonvolatile memory cell having a first path terminal coupled to one of said first and second supply terminals, a second path terminal coupled to said control terminal of said third switch, and a control terminal coupled to receive a fuse control signal; and a load device coupled between said second path terminal of said nonvolatile memory cell and the other of said first and second supply terminals.

\* \* \* \* \*